United States Patent
Daubenspeck et al.

(10) Patent No.: US 8,819,933 B2
(45) Date of Patent: Sep. 2, 2014

(54) METHOD FOR FORMING A CURRENT DISTRIBUTION STRUCTURE

(75) Inventors: Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 944 days.

(21) Appl. No.: 12/957,431

(22) Filed: Dec. 1, 2010

(65) Prior Publication Data

US 2011/0072656 A1 Mar. 31, 2011

Related U.S. Application Data

(62) Division of application No. 11/872,870, filed on Oct. 16, 2007, now Pat. No. 7,911,803.

(51) Int. Cl.
    *H01R 43/02* (2006.01)
(52) U.S. Cl.
    USPC ............... 29/860; 29/840; 29/846; 174/261; 438/612
(58) Field of Classification Search
    CPC ... H01L 23/49838; H01L 24/11; H01L 24/13; H05K 1/0265; H05K 1/111; H05K 2201/0979
    USPC ........... 29/832, 840, 846, 857, 860; 174/261; 257/773, 781; 438/612
    See application file for complete search history.

(56) References Cited

U.S. PATENT DOCUMENTS

| | | | |
|---|---|---|---|
| 5,101,261 A | 3/1992 | Maeda | |
| 5,712,510 A | 1/1998 | Bui et al. | |
| 6,320,262 B1 | 11/2001 | Murakami | |
| 6,566,611 B2 | 5/2003 | Kochanowski et al. | |
| 6,822,327 B1 * | 11/2004 | Mithal et al. | 257/734 |
| 7,034,402 B1 | 4/2006 | Seshan | |
| 7,042,098 B2 * | 5/2006 | Harun et al. | 29/846 |
| 7,208,843 B2 * | 4/2007 | Richling et al. | 438/612 |
| 7,297,631 B2 | 11/2007 | Nair et al. | |
| 2003/0173684 A1 | 9/2003 | Joshi et al. | |
| 2005/0158980 A1 | 7/2005 | Seshan | |
| 2006/0170100 A1 | 8/2006 | Richling et al. | |
| 2006/0186539 A1 | 8/2006 | Dauksher et al. | |
| 2006/0211167 A1 | 9/2006 | Knickerbocker et al. | |
| 2009/0286108 A1 | 11/2009 | Kim et al. | |

OTHER PUBLICATIONS

Notice of Allowance (Mail Date Nov. 16, 2010) for U.S. Appl. No. 11/872,870, filed Oct. 16, 2007, Confirmation No. 9667.

* cited by examiner

*Primary Examiner* — Donghai D Nguyen
(74) *Attorney, Agent, or Firm* — Schmeiser, Olsen & Watts; Richard M. Kotulak

(57) ABSTRACT

A method for forming an electrical structure. The electrical structure comprises an interconnect structure and a substrate. The substrate comprises an electrically conductive pad and a plurality of wire traces electrically connected to the electrically conductive pad. The electrically conductive pad is electrically and mechanically connected to the interconnect structure. The plurality of wire traces comprises a first wire trace, a second wire trace, a third wire trace, and a fourth wire trace. The first wire trace and second wire trace are each electrically connected to a first side of the electrically conductive pad. The third wire trace is electrically connected to a second side of the electrically conductive pad. The fourth wire trace is electrically connected to a third side of said first electrically conductive pad. The plurality of wire traces are configured to distribute a current.

15 Claims, 7 Drawing Sheets

METHOD FOR FORMING A CURRENT DISTRIBUTION STRUCTURE

This application is a divisional application claiming priority to Ser. No. 11/872,870, filed Oct. 16, 2007, now U.S. Pat. No. 7,911,803.

FIELD OF THE INVENTION

The present invention relates to forming an electrical structure for distributing a current signal.

BACKGROUND OF THE INVENTION

Structures formed on a substrate typically do not comprise the ability to route signals to various portions of the structures. Accordingly, there exists a need in the art to overcome at least one of the deficiencies and limitations described herein above.

SUMMARY OF THE INVENTION

The present invention provides an electrical structure comprising:
a first interconnect structure; and
a first substrate, wherein said first substrate comprises a first electrically conductive pad and a first plurality of wire traces electrically connected to said first electrically conductive pad, wherein said first electrically conductive pad is electrically and mechanically connected to said first interconnect structure, wherein said first plurality of wire traces comprises a first wire trace, a second wire trace, a third wire trace, and a fourth wire trace, wherein said first wire trace is electrically connected to a first side of said first electrically conductive pad, wherein said second wire trace is electrically connected to said first side of said first electrically conductive pad, wherein said third wire trace is electrically connected to a second side of said first electrically conductive pad, wherein said fourth wire trace is electrically connected to a third side of said first electrically conductive pad, wherein said first side of said first electrically conductive pad is connected to said second side of said first electrically conductive pad at a first non-zero degree angle, wherein said first side of said first electrically conductive pad is connected to said third side of said first electrically conductive pad at a second non-zero degree angle, wherein said first plurality of wire traces are configured to distribute a current traveling along said first plurality of wire traces such that said current enters said first electrically conductive pad in discrete locations in order to reduce electro migration of material comprised by said first interconnect structure, and wherein said first interconnect structure is configured to electrically connect said first electrically conductive pad to a second electrically conductive pad on a second substrate.

The present invention provides a method for forming an electrical structure comprising:
providing a first substrate;
forming a first electrically conductive pad on said first substrate;
forming a first plurality of wire traces on said first substrate, wherein said first plurality of wire traces are electrically connected to said first electrically conductive pad, wherein said first plurality of wire traces comprises a first wire trace, a second wire trace, a third wire trace, and a fourth wire trace, wherein said first wire trace is electrically connected to a first side of said first electrically conductive pad, wherein said second wire trace is electrically connected to said first side of said first electrically conductive pad, wherein said third wire trace is electrically connected to a second side of said first electrically conductive pad, wherein said fourth wire trace is electrically connected to a third side of said first electrically conductive pad, wherein said first side of said first electrically conductive pad is connected to said second side of said first electrically conductive pad at a first non-zero degree angle, wherein said first side of said first electrically conductive pad is connected to said third side of said first electrically conductive pad at a second non-zero degree angle, wherein said first plurality of wire traces are configured to distribute a current traveling along said first plurality of wire traces such that said current enters said first electrically conductive pad in discrete locations in order to reduce electro migration of material comprised by said first interconnect structure; and
forming a first interconnect structure electrically and mechanically connected to said first electrically conductive pad, wherein said first interconnect structure is configured to electrically connect said first electrically conductive pad to a second electrically conductive pad on a second substrate.

The present invention advantageously provides a simple structure and associated method for routing signals to various portions of structures.

DETAILED DESCRIPTION OF THE INVENTION

Figure 1:
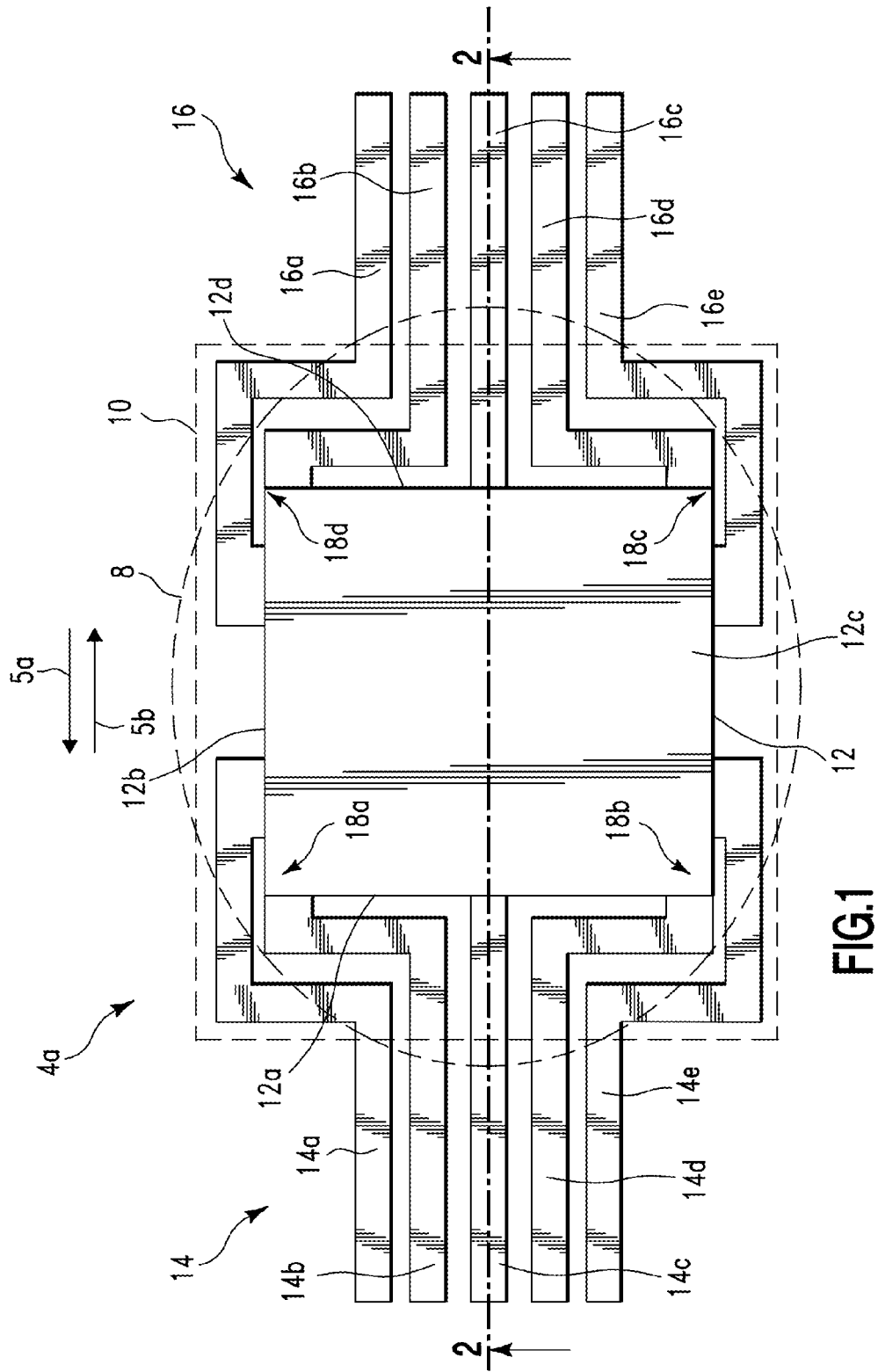
FIG. 1 illustrates a top view of an electrical structure, in accordance with embodiments of the present invention.

FIG. 1 illustrates a top view of an electrical structure 4a, in accordance with embodiments of the present invention. Electrical structure 4a comprises an electrically conductive pad 12, a plurality of wire traces 14, a plurality of wire traces 16, an intermediate pad 10, a ball limiting metallurgy structure 15 (i.e., shown in FIG. 2), an interconnect structure 8, an insulator layer 19 (i.e., shown in FIG. 2), and a photosensitive polyimide (PSPI) layer 21 (i.e., shown in FIG. 2). Interconnect structure 8 may comprise a solder material. Solder material is defined herein as a metal alloy comprising a low melting point (i.e., about 100 degrees Celsius to about 340 degrees Celsius) that is used to join metallic surfaces together without melting the metallic surfaces. A solder material may include, inter alia, an alloy of tin such as SnCu, SnAgCu, SnPb, etc. Interconnect structure 8 may comprise a controlled collapse chip connector (C4) solderball. Alternatively, interconnect structure 8 may comprise a non-solder metallic material (i.e., does not comprise any solder material) such as, inter alia, copper, gold, nickel, etc. Intermediate pad 10 may comprise, inter alia, aluminum, etc. Electrical structure 4a is formed on a substrate (i.e., substrate 7 illustrated in FIG. 2). Electrical structure 4a electrically and mechanically connects components and/or circuits on substrate 7 to components and/or circuits on a second substrate (i.e., substrate 33 illustrated in FIG. 2). Wire traces 14 comprise a wire trace 14a, a wire trace 14b, a wire trace 14c, a wire trace 14d, and a wire trace 14e. Wire trace is 14a is electrically (and mechanically) connected to a side 12b of electrically conductive pad 12. Wire trace is 14b is electrically connected to a side 12a of electrically conductive pad 12. The connection between wire trace 14b and side 12a is located adjacent to corner 18a of electrically conductive pad 12. Wire trace is 14d is electrically connected to side 12a of electrically conductive pad 12. The connection between wire trace 14d and side 12a is located adjacent to corner 18b of electrically conductive pad 12. Wire trace is 14c is electrically connected to side 12a of electrically conductive pad 12. The connection between wire trace 14c and side 12a is located on a portion of side 12a located between the connection of wire trace 14d and side 12a and the connection of wire trace 14b and side 12a. Wire trace is 14e is electrically connected to a side 12c of electrically conductive pad 12. Wires traces 14a, 14b, 14d, and 14e each comprise a geometry that forms a plurality of angles (i.e., 90 degree angles). Wire traces 14 are formed in the aforementioned configuration so that a current signal (i.e., current signal originating from other components and/or circuits on substrate 7 or substrate 33) traveling along wire traces 14 in a direction 5a is evenly distributed among wire traces 14a . . . 14e (or alternatively traveling from electrically conductive pad 12 to wire traces 14 in a direction 5b). The current signal distributed among wire traces 14a . . . 14e enters electrically conductive pad 12 in discrete locations in order to reduce a current density of the current signal entering electrically conductive pad 12 and interconnect structure 8. A reduction in the current density entering interconnect structure 8 reduces an electro migration of material comprised by interconnect structure 8 (e.g., solder material, non-solder material, etc). Electro migration is defined herein as a migration or transport of material (e.g., material comprised by interconnect structure 8) caused by a gradual movement of ions (e.g., in the material comprised by interconnect structure 8) due to a momentum exchange between conducting electrons and diffusing metal atoms. Electro migration of material comprised by interconnect structure 8 causes portions of interconnect structure 8 to comprise a reduced density of material in the portions of interconnect structure 8.

Wire traces 16 comprise a wire trace 16a, a wire trace 16b, a wire trace 16c, a wire trace 16d, and a wire trace 16e. Wire trace is 16a is electrically (and mechanically) connected to side 12b of electrically conductive pad 12. Wire trace is 16b is electrically connected to side 12d of electrically conductive pad 12. The connection between wire trace 16b and side 12d is located adjacent to corner 18d of electrically conductive pad 12. Wire trace is 16d is electrically connected to side 12d of electrically conductive pad 12. The connection between wire trace 16d and side 12d is located adjacent to corner 18c of electrically conductive pad 12. Wire trace is 14c is electrically connected to side 12d of electrically conductive pad 12. The connection between wire trace 16c and side 12d is located on a portion of side 12d located between the connection of wire trace 16d and side 12d and the connection of wire trace 16b and side 12d. Wire trace is 16e is electrically connected to side 12c of electrically conductive pad 12. Wires traces 16a, 16b, 16d, and 16e each comprise a geometry that forms a plurality of angles (i.e., 90 degree angles). Wire traces 16 are formed in the aforementioned configuration so that a current signal (i.e., current signal originating from other components and/or circuits on substrate 7 or substrate 33) traveling along wire traces 16 in a direction 5b is distributed among wire traces 16a . . . 16e (or alternatively traveling from electrically conductive pad 12 to wire traces 16 in a direction 5a). The current signal distributed among wire traces 16a . . . 16e enters electrically conductive pad 12 in discrete locations in order to reduce a current density of the current signal entering electrically conductive pad 12 and interconnect structure 8. A reduction in the current density entering interconnect structure 8 reduces an electro migration of material comprised by interconnect structure 8 (e.g., solder material, non-solder material, etc).

Figure 2:
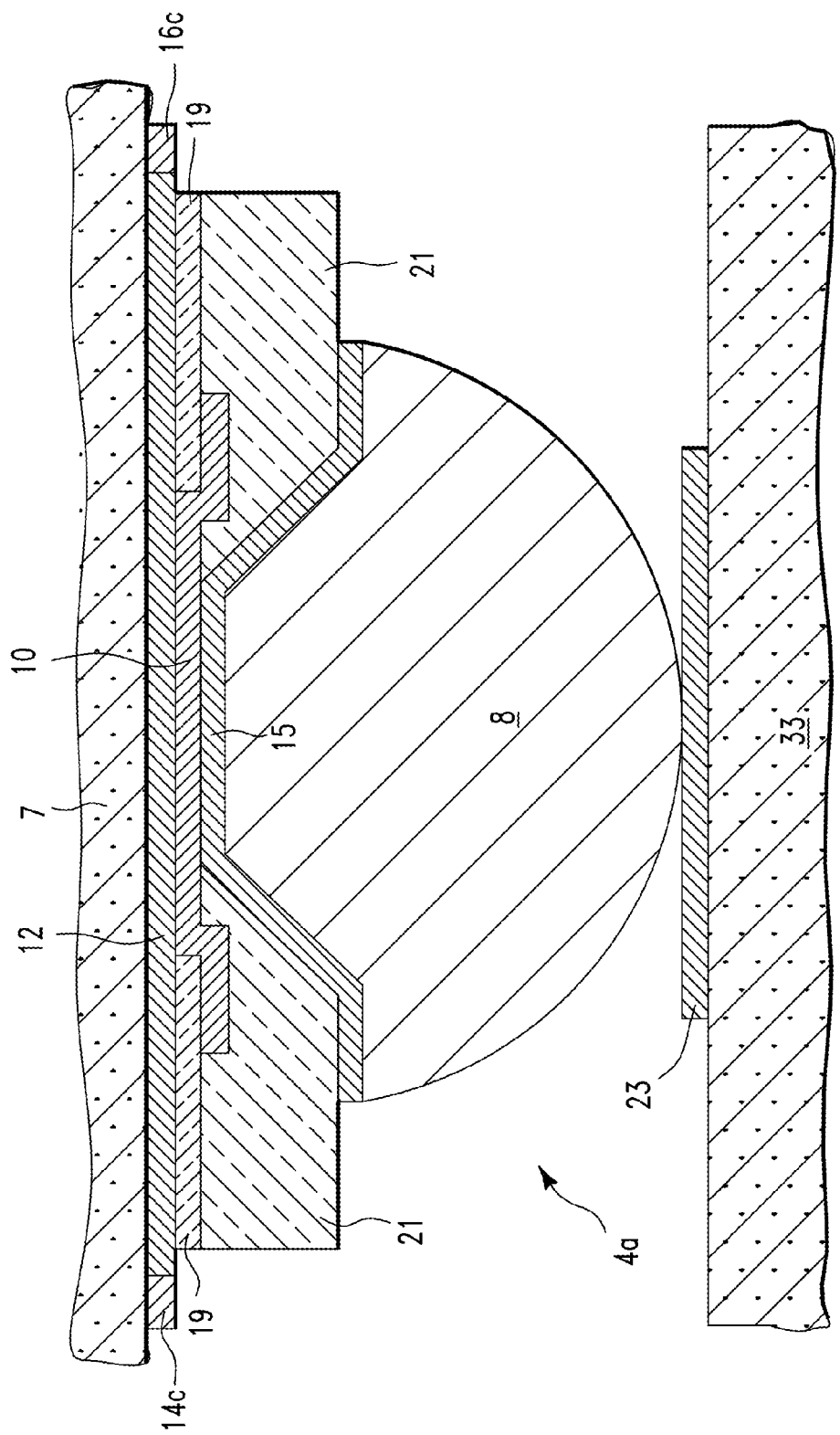
FIG. 2 illustrates a cross sectional view of the electrical structure of FIG. 1, in accordance with embodiments of the present invention.

FIG. 2 illustrates a cross sectional view of electrical structure 4a of FIG. 1, in accordance with embodiments of the present invention. The cross sectional view of FIG. 2 is taken along line 2-2 of FIG. 1. The cross sectional view in FIG. 2 illustrates substrate 7, wire trace 14c, electrically conductive pad 12, wire trace 16c, intermediate pad 10, ball limiting metallurgy structure 15, interconnect structure 8, insulator layer 19, photosensitive polyimide (PSPI) layer 21, electrically conductive pad 23, and substrate 33. Electrically conductive pad 12 10 may be connected to wires or electrical components within substrate 7. Electrically conductive pad 23 may be connected to wires or electrical components within substrate 33. Substrate 7 may comprise, inter alia, a semiconductor device (e.g., an integrated circuit chip, a semiconductor wafer, etc), a chip carrier (organic or inorganic), a printed circuit board, etc. Substrate 33 may comprise, inter alia, a semiconductor device (e.g., an integrated circuit chip, a semiconductor wafer, etc), a chip carrier (organic or inorganic), a printed circuit board, etc. Insulator layer 19 may comprise any insulator material including, inter alia, silicon dioxide, silicon nitride, etc.

Figure 3:
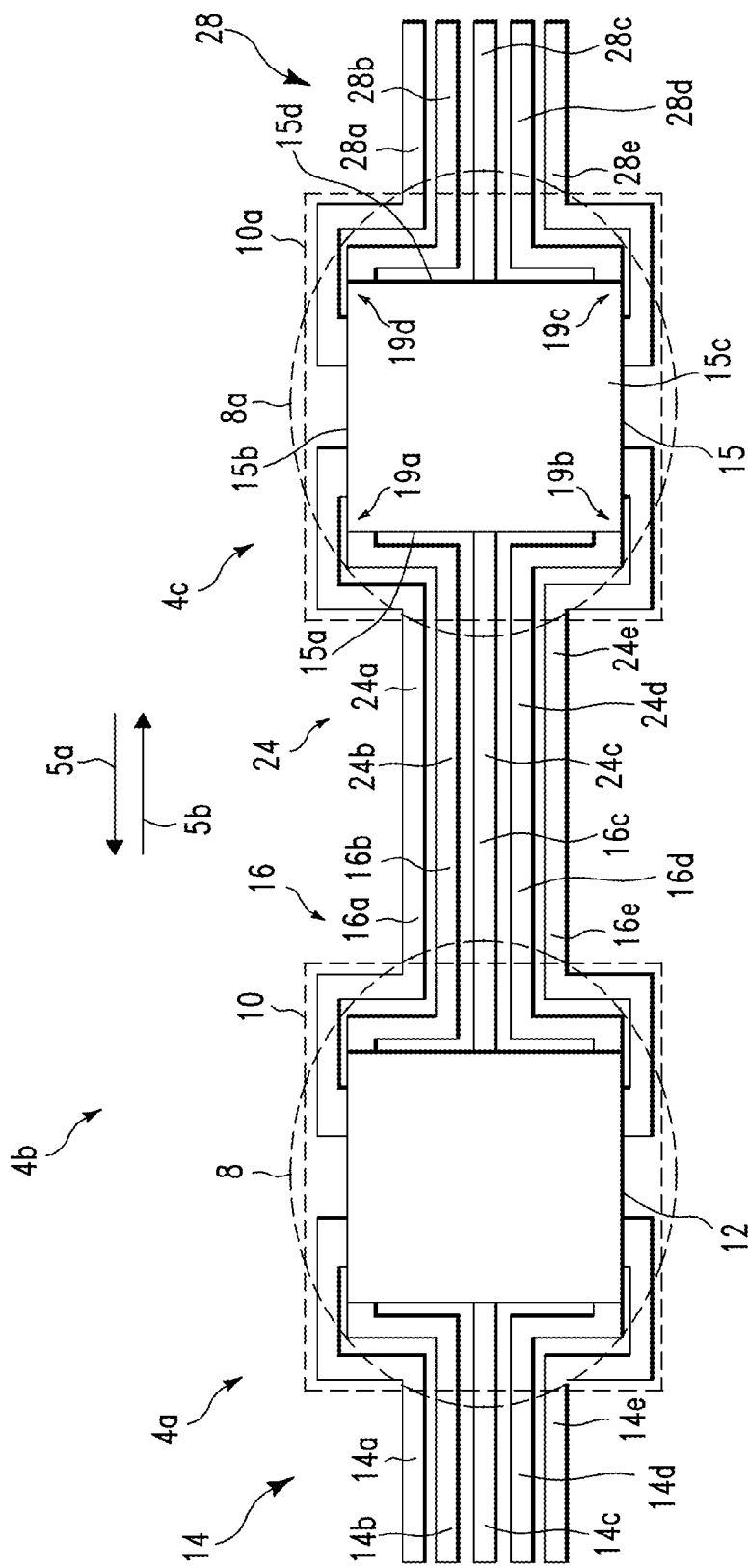
FIG. 3 depicts a first alternative to FIG. 1, in accordance with embodiments of the present invention

FIG. 3 depicts a first alternative to FIG. 1 illustrating a top view of an electrical structure 4b, in accordance with embodiments of the present invention. Electrical structure 4b of FIG. 3 comprises electrical structure 4a of FIG. 1 and electrical structure 4c similar to electrical structure 4a. Electrical structure 4c comprises an electrically conductive pad 15, a plurality of wire traces 24, a plurality of wire traces 28, an intermediate pad 10a, a ball limiting metallurgy structure 15 (i.e., shown in FIG. 2), an interconnect structure 8a, an insulator layer 19 (i.e., shown in FIG. 2), and a photosensitive polyimide (PSPI) layer 21 (i.e., shown in FIG. 2). Interconnect structure 8a may comprise a solder material. Alternatively, interconnect structure 8a may comprise a non-solder metallic material (i.e., does not comprise any solder material) such as, inter alia, copper, gold, nickel, etc. Intermediate pad 10 may comprise, inter alia, aluminum, etc. Electrical structure 4c is formed on a substrate (i.e., substrate 7 illustrated in FIG. 2). Electrical structure 4c electrically and mechanically connects components and/or circuits on substrate 7 to components and/or circuits on a second substrate (i.e., substrate 33 illustrated in FIG. 2). Wire traces 24 comprise a wire trace 24a, a wire trace 24b, a wire trace 24c, a wire trace 24d, and a wire trace 24e. Wire trace is 24a is electrically (and mechanically) connected to a side 15b of electrically conductive pad 15. Wire trace is 24b is electrically connected to a side 15a of electrically conductive pad 15. The connection between wire trace 24b and side 15a is located adjacent to corner 19a of electrically conductive pad 15. Wire trace is 24d is electrically connected to side 15a of electrically conductive pad 15. The connection between wire trace 24d and side 15a is located adjacent to corner 198b of electrically conductive pad 15. Wire trace is 24c is electrically connected to side 15a of electrically conductive pad 15. The connection between wire trace 24c and side 15a is located on a portion of side 15a located between the connection of wire trace 24d and side 15a and the connection of wire trace 24b and side 15a. Wire trace is 24e is electrically connected to a side 15c of electrically conductive pad 15. Wires traces 15a, 15b, 15d, and 15e each comprise a geometry that forms a plurality of angles (i.e., 90 degree angles). Wire traces 24 are formed in the aforementioned configuration so that a current signal (i.e., current signal originating from other components and/or circuits on substrate 7 or substrate 33 or from electrical structure 4a) traveling along wire traces 24 in a direction 5a is evenly distributed among wire traces 24a . . . 24e (or alternatively traveling from electrically conductive pad 15 to wire traces 24 in a direction 5b). The current signal distributed among wire traces 24a . . . 24e enters electrically conductive pad 15 in discrete locations in order to reduce a current density of the current signal entering electrically conductive pad 15 and interconnect structure 8a. A reduction in the current density entering interconnect structure 8a reduces an electro migration of material comprised by interconnect structure 8a (e.g., solder material, non-solder material, etc). Electro migration of material comprised by interconnect structure 8a causes portions of interconnect structure 8a to comprise a reduced density of material in the portions of interconnect structure 8a.

Wire traces 28 comprise a wire trace 28a, a wire trace 28b, a wire trace 28c, a wire trace 28d, and a wire trace 28e. Wire trace is 28a is electrically (and mechanically) connected to side 28b of electrically conductive pad 15. Wire trace is 28b is electrically connected to side 15d of electrically conductive pad 15. The connection between wire trace 28b and side 15d is located adjacent to corner 19d of electrically conductive pad 12. Wire trace is 16d is electrically connected to side 12d of electrically conductive pad 15. The connection between wire trace 28d and side 15d is located adjacent to corner 19c of electrically conductive pad 15. Wire trace is 14c is electrically connected to side 12d of electrically conductive pad 12. The connection between wire trace 28c and side 15d is located on a portion of side 15d located between the connection of wire trace 28d and side 15d and the connection of wire trace 28b and side 15d. Wire trace is 28e is electrically connected to side 15c of electrically conductive pad 15. Wires traces 28a, 28b, 28d, and 28e each comprise a geometry that forms a plurality of angles (i.e., 90 degree angles). Wire traces 28 are formed in the aforementioned configuration so that a current signal (i.e., current signal originating from other components and/or circuits on substrate 7 or substrate 33) traveling along wire traces 16 in a direction 5b is distributed among wire traces 28a . . . 28e (or alternatively traveling from electrically conductive pad 15 to wire traces 28 in a direction 5a). The current signal distributed among wire traces 28a . . . 28e enters electrically conductive pad 15 in discrete locations in order to reduce a current density of the current signal entering electrically conductive pad 15 and interconnect structure 8a. A reduction in the current density entering interconnect structure 8a reduces an electro migration of material comprised by interconnect structure 8a (e.g., solder material, non-solder material, etc).

Wire traces 16 of electrical structure 4a are electrically and mechanically connected to wire traces 24 of electrical structure 4c thereby electrically and mechanically connecting electrical structure 4a to electrical structure 4c in order to form electrical structure 4b.

Figure 4:
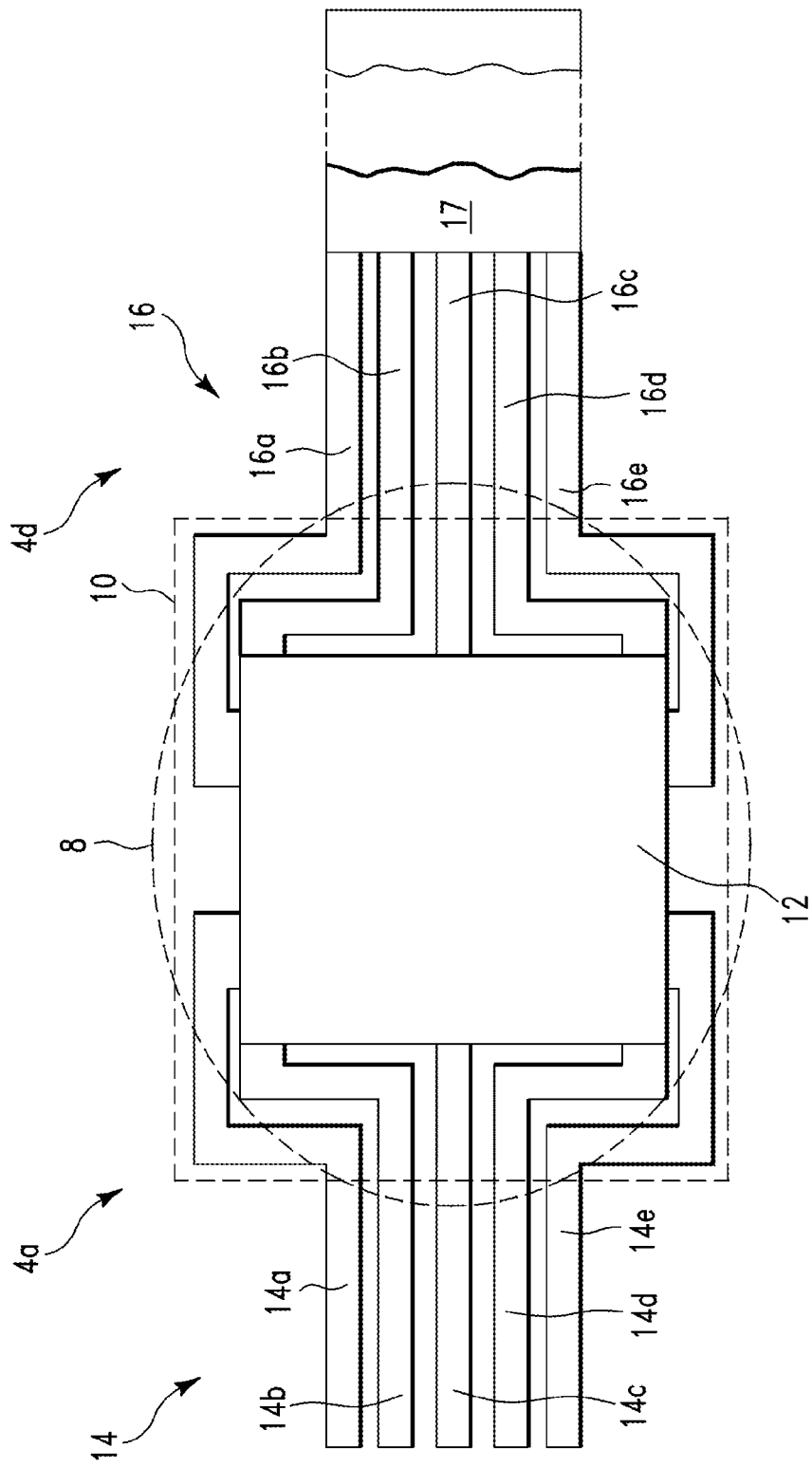
FIG. 4 depicts a second alternative to FIG. 1, in accordance with embodiments of the present invention.

FIG. 4 depicts a second alternative to FIG. 1 illustrating a top view of an electrical structure 4d, in accordance with embodiments of the present invention. Electrical structure 4d of FIG. 4 comprises electrical structure 4a of FIG. 1 electrically and mechanically connected to a single wire trace 17. Electrical structure 4d is formed on a substrate (i.e., substrate 7 illustrated in FIG. 2). Electrical structure 4d electrically and mechanically connects components and/or circuits on substrate 7 to components and/or circuits on a second substrate (i.e., substrate 33 illustrated in FIG. 2). Single wire trace 17 may be connected to electrical circuits or electrical components on substrate 7.

Figure 5:
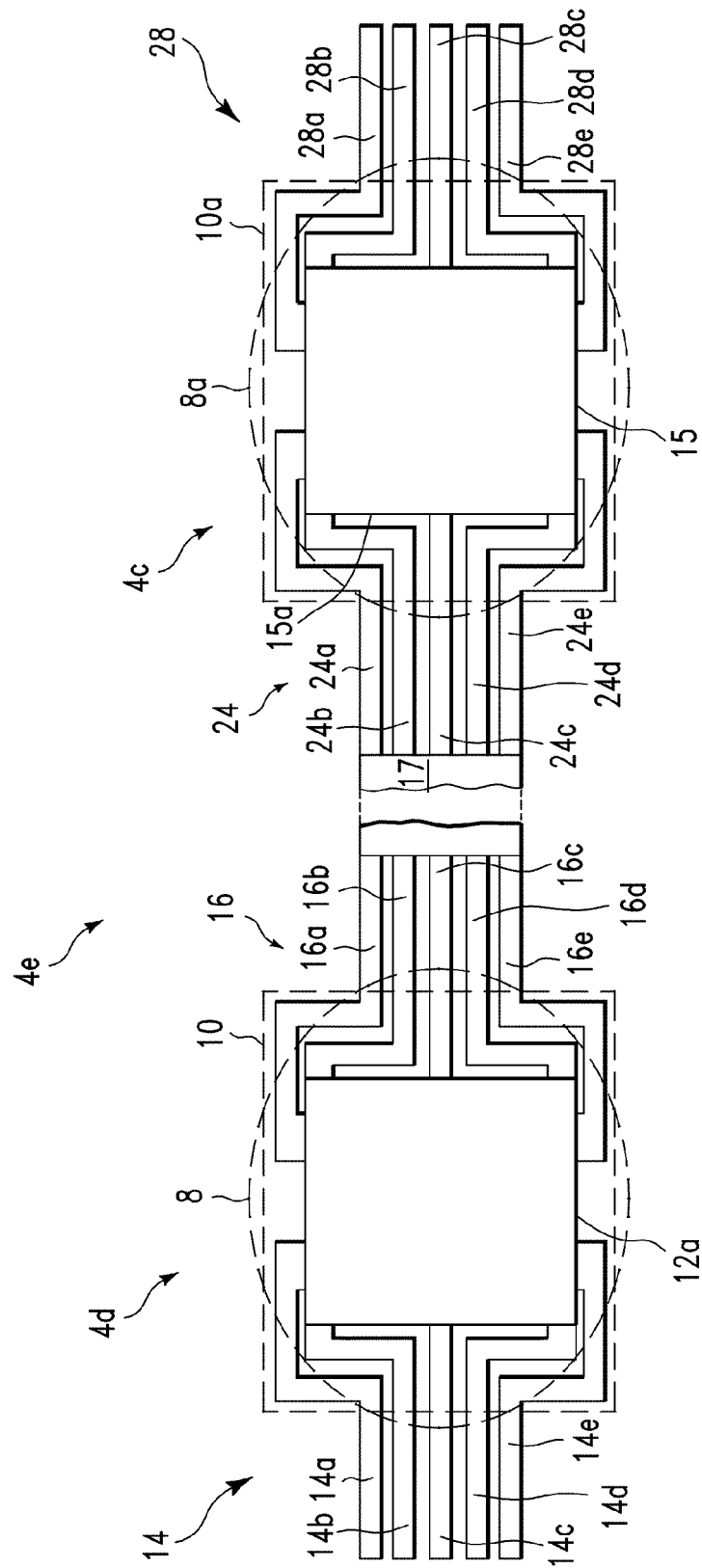
FIG. 5 depicts a first alternative to FIG. 3 and FIG. 4, in accordance with embodiments of the present invention.

FIG. 5 depicts a first alternative to FIG. 3 and FIG. 4 illustrating a top view of an electrical structure 4e, in accordance with embodiments of the present invention. Electrical structure 4e of FIG. 5 comprises electrical structure 4d of FIG. 4 electrically and mechanically connected to electrical structure 4c of FIG. 3 via single wire trace 17. Electrical structure 4e is formed on a substrate (i.e., substrate 7 illustrated in FIG. 2).

Figure 6:
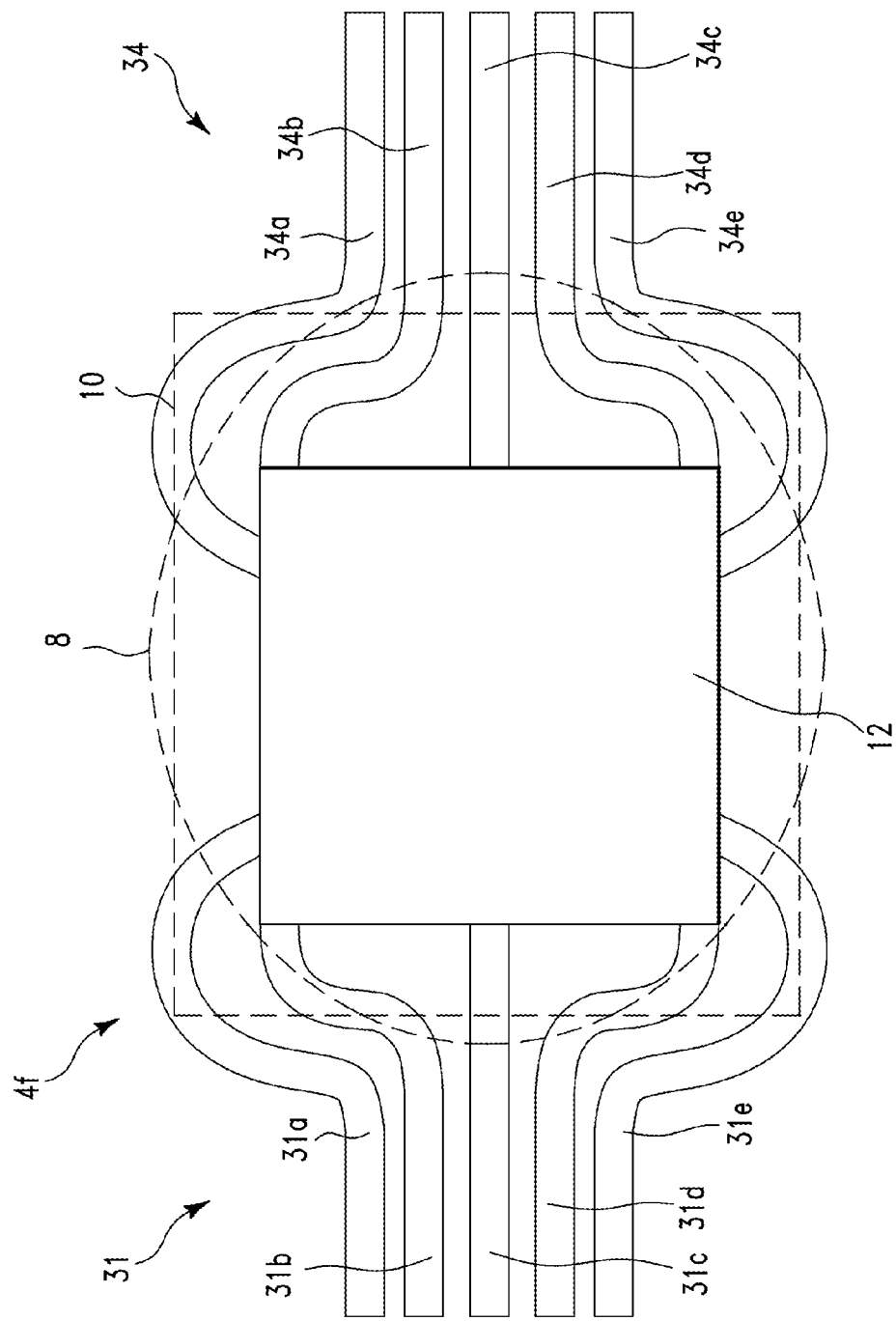
FIG. 6 depicts a third alternative to FIG. 1, in accordance with embodiments of the present invention

FIG. 6 depicts a third alternative to FIG. 1 illustrating a top view of an electrical structure 4f, in accordance with embodiments of the present invention. In contrast with electrical structure 4a of FIG. 1, electrical structure 4f of FIG. 6 comprises plurality of wire traces 31 and plurality of wire traces 34. Wire traces 31 comprises wire traces 31a . . . 31e. Wire traces 31a, 31b, 31d, and 31e each comprise a curved wire section mechanically and electrically connected to electrically conductive pad 12. Wire traces 34 comprise wire traces 34a . . . 34e. Wire traces 34a, 34b, 34d, and 34e each comprise a curved wire section mechanically and electrically connected to electrically conductive pad 12.

Figure 7:
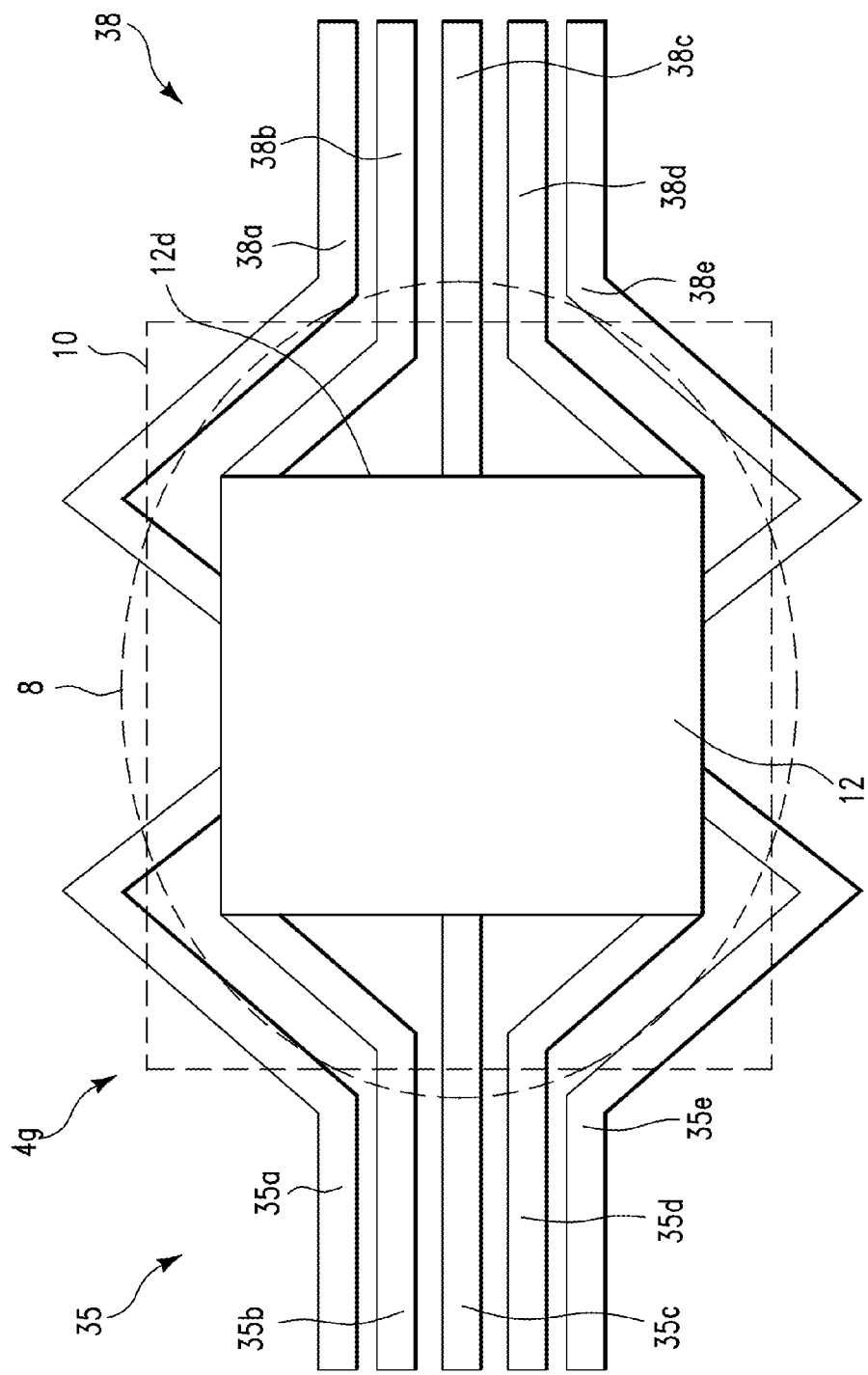
FIG. 7 depicts a first alternative to FIG. 6, in accordance with embodiments of the present invention

FIG. 7 depicts a first alternative to FIG. 6 illustrating a top view of an electrical structure 4g, in accordance with embodiments of the present invention. In contrast with electrical structure 4f of FIG. 6, electrical structure 4g of FIG. 7 comprises plurality of wire traces 35 and plurality of wire traces 38. Wire traces 35 comprises wire traces 35a . . . 35e. Wire traces 35a, 35b, 35d, and 35e each comprise an angular wire section (i.e., comprising at least one internal angle within a traversing path of each of wire traces 35a, 35b, 35d, and 35e and may comprise a non-ninety degree angle) mechanically and electrically connected to electrically conductive pad 12. Wire traces 38 comprise wire traces 38a . . . 38e. Wire traces 38a, 38b, 38d, and 38e each comprise an angular wire section (i.e., comprising at least one internal angle within a traversing path of each of wire traces 38a, 38b, 38d, and 38e and may comprise a non-ninety degree angle) mechanically and electrically connected to electrically conductive pad 12.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming an electrical structure comprising:
   providing a first substrate;
   forming a first electrically conductive pad on said first substrate;
   forming a first plurality of wire traces on said first substrate, wherein said first plurality of wire traces are electrically connected to said first electrically conductive pad, wherein said first plurality of wire traces comprises a first wire trace, a second wire trace, a third wire trace, and a fourth wire trace, wherein said first wire trace is electrically connected to said first electrically conductive pad, wherein said first wire trace comprises an independent wire trace that is mechanically connected to a first side of said first electrically conductive pad, wherein said second wire trace is electrically connected to said first electrically conductive pad, wherein said second wire trace comprises an independent wire trace that is mechanically connected to said first side of said first electrically conductive pad, wherein said third wire trace is electrically connected to said first electrically conductive pad, wherein said third wire trace comprises an independent wire trace that is mechanically connected to a second side of said first electrically conductive pad, wherein said fourth wire trace is electrically connected to said first electrically conductive pad, wherein said fourth wire trace comprises an independent wire trace that is mechanically connected to a third side of said first electrically conductive pad, wherein said first side of said first electrically conductive pad differs from said second side of said first electrically conductive pad and said third side of said first electrically conductive pad, wherein said second side of said first electrically conductive pad differs from said third side of said first electrically conductive pad, wherein said first side of said first electrically conductive pad is connected to said second side of said first electrically conductive pad at a first non-zero degree angle, wherein said first side of said first electrically conductive pad is connected to said third side of said first electrically conductive pad at a second non-zero degree angle;
forming an insulator layer mechanically connected said first electrically conductive pad;
forming an intermediate conductive pad mechanically and electrically connected to said first electrically conductive pad and said insulator layer;
forming a photosensitive polyimide layer mechanically connected said intermediate conductive pad and said insulator layer
forming a metallurgy structure mechanically and electrically connected to said intermediate conductive pad, wherein said photosensitive polyimide layer is formed between and mechanically connected to a portion of said metallurgy structure and a portion of said intermediate conductive pad, wherein a portion of said insulator layer is formed between said intermediate conductive pad and said first electrically conductive pad, and wherein said intermediate conductive pad is formed between and electrically and mechanically connected to said first electrically conductive pad and said metallurgy structure; and
forming a first interconnect structure electrically and mechanically connected to said metallurgy structure, wherein said first plurality of wire traces are configured to distribute a current traveling along said first plurality of wire traces such that said current enters said first electrically conductive pad in discrete locations in order to reduce electro migration of material comprised by said first interconnect structure, and wherein said first interconnect structure is configured to electrically connect said first electrically conductive pad to a second electrically conductive pad on a second substrate.

2. The method of claim 1, wherein second side of said first electrically conductive pad is perpendicular to said first side of said first electrically conductive pad, and wherein said third side of said first electrically conductive pad is perpendicular to said first side of said first electrically conductive pad.

3. The method of claim 2, wherein said first wire trace is electrically connected to a first portion of said first side of said first electrically conductive pad, wherein said first portion is adjacent to a first corner formed from said first side of said first electrically conductive pad and said second side of said first electrically conductive pad, wherein said second wire trace is electrically connected to a second portion of said first side of said first electrically conductive pad, and wherein said second portion is adjacent to a second corner formed from said first side of said first electrically conductive pad and said third side of said first electrically conductive pad.

4. The method of claim 1, further comprising:
forming a second plurality of wire traces on said first substrate, wherein said second plurality of wire traces are electrically connected to said first electrically conductive pad, wherein said second plurality of wire traces comprises a fifth wire trace, a sixth wire trace, a seventh wire trace, and an eighth wire trace, wherein said fifth wire trace is electrically connected to a fourth side of said first electrically conductive pad, wherein said sixth wire trace is electrically connected to said fourth side of said first electrically conductive pad, wherein said seventh wire trace is electrically connected to said second side of said first electrically conductive pad, wherein said eighth wire trace is electrically connected to said third side of said first electrically conductive pad, wherein said fourth side of said first electrically conductive pad is connected to said second side of said first electrically conductive pad at a third non-zero degree angle, and wherein said fourth side of said first electrically conductive pad is connected to said third side of said first electrically conductive pad at a fourth non-zero degree angle.

5. The method of claim 1, further comprising:
forming a single wire trace on said first substrate, wherein said single wire trace is electrically connected to said first plurality of wire traces.

6. The method of claim 5, further comprising:
forming a third electrically conductive pad on said first substrate;
forming a second plurality of wire traces on said first substrate, wherein said second plurality of wire traces are electrically connected to said third electrically conductive pad, wherein said single wire trace is electrically connected to said second plurality of wire traces, wherein said second plurality of wire traces comprises a fifth wire trace, a sixth wire trace, a seventh wire trace, and an eighth wire trace, wherein said fifth wire trace is electrically connected to a first side of said third electrically conductive pad, wherein said sixth wire trace is electrically connected to said first side of said third electrically conductive pad, wherein said seventh wire trace is electrically connected to a second side of said third electrically conductive pad, wherein said eighth wire trace is electrically connected to a third side of said third electrically conductive pad, wherein said first side of said third electrically conductive pad is connected to said second side of said third electrically conductive pad at a third non-zero degree angle, and wherein said first side of said third electrically conductive pad is connected to said third side of said third electrically conductive pad at a fourth non-zero degree angle; and
forming a second interconnect structure electrically and mechanically connected to said third electrically conductive pad, wherein said second interconnect structure is configured to electrically connect said third electrically conductive pad to a fourth electrically conductive pad on said second substrate.

7. The method of claim 1, wherein said first wire trace comprises: a first section that is perpendicular to said first side, a second section that is parallel to said first side, and a third section is perpendicular to said first side, wherein said second wire trace comprises: a first section that is perpendicular to said first side, a second section that is parallel to said first side, and a third section that is perpendicular to said first side, wherein said third wire trace comprises: a first section that is perpendicular to said first side, a second section that is parallel to said first side, a third section that is parallel to said second side, and a fourth section that is perpendicular to said second side, and wherein said fourth wire trace comprises: a first section that is perpendicular to said first side, a second section that is parallel to said first side, a third section that is parallel to said second side, and a fourth section that is perpendicular to said second side.

8. The method of claim 1, wherein said first wire trace comprises a first curved section electrically connected to said first side of said first electrically conductive pad, wherein said second wire trace comprises a second curved section electrically connected to said first side of said first electrically conductive pad, wherein said third wire trace comprises a third curved section electrically connected to said second side of said first electrically conductive pad, and wherein said fourth wire trace comprises a fourth curved section electrically connected to said third side of said first electrically conductive pad.

9. The method of claim 1, wherein said first interconnect structure comprises a solder material.

10. The method of claim 9, wherein said solder interconnect structure comprises a controlled collapse chip connector (C4) solderball.

11. The method of claim 1, wherein said first interconnect structure comprises a non-solder interconnect structure that does not comprise any solder material.

12. The method of claim 1, wherein a first portion of said insulator layer is formed between said photosensitive polyimide layer and said first electrically conductive pad.

13. The method of claim 1, wherein a portion of said photosensitive polyimide layer is formed between said metallurgy structure and said insulator layer.

14. The method of claim 1, wherein said photosensitive polyimide layer is mechanically connected to a first vertical surface and a second vertical surface of said intermediate conductive pad, and wherein said photosensitive polyimide layer is mechanically connected to a first horizontal surface and a second horizontal surface of said intermediate conductive pad.

15. The method of claim 14, wherein said photosensitive polyimide layer is mechanically connected to a first horizontal surface of said metallurgy structure and a first angular surface of said metallurgy structure.

* * * * *